Figure 1:
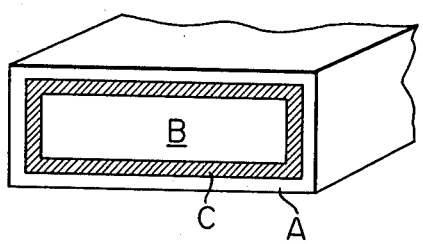

United States Patent [19]

Tachikawa et al.

[11] 4,323,402
[45] Apr. 6, 1982

[54] METHOD FOR PRODUCING SUPERCONDUCTING NB3SN WIRES

[75] Inventors: Kyoji Tachikawa; Hisashi Sekine, both of Tokyo, Japan

[73] Assignee: National Research Institute for Metals, Tokyo, Japan

[21] Appl. No.: 249,473

[22] Filed: Mar. 31, 1981

Related U.S. Application Data

[63] Continuation-in-part of Ser. No. 118,994, Feb. 6, 1980, abandoned.

[30] Foreign Application Priority Data

Feb. 9, 1979 [JP] Japan .................................. 54-13407

[51] Int. Cl.$^3$ .......................... H01L 39/00; C23C 1/04
[52] U.S. Cl. ...................................... 148/133; 29/599; 204/37 T; 428/930
[58] Field of Search .......................... 428/930; 29/299; 75/174; 148/11.5 Q, 11.5 R, 11.5 F, 127, 133; 427/62; 174/126 S; 204/37 R, 37 T

[56] References Cited

U.S. PATENT DOCUMENTS

| | | | |
|---|---|---|---|
| 3,244,490 | 4/1966 | Saur | 75/174 |
| 3,792,990 | 2/1974 | Tachikawa et al. | 75/134 V |
| 4,224,087 | 9/1980 | Tachikawa et al. | 148/11.5 Q |

FOREIGN PATENT DOCUMENTS

| | | | |
|---|---|---|---|
| 902802 | 6/1972 | Canada | 29/599 |
| 1028183 | 5/1966 | United Kingdom | 428/930 |
| 1342726 | 1/1974 | United Kingdom | 427/62 |

*Primary Examiner*—Peter K. Skiff

[57] ABSTRACT

In a method of producing a superconducting Nb3Sn wire which comprises passing a wire or tape of a niobium-base alloy through a molten metal bath containing tin and then heat-treating it to form a Nb3Sn compound layer on the surface of said wire or tape, the improvement wherein said niobium-base alloy is an alloy comprising niobium and 0.1 to 30 atomic percent of hafnium, and said molten metal bath is a molten bath of pure tin or a tin-base alloy consisting of tin, from 0.1 to 70 atomic percent of one element of Group IIIb of the periodic table selected from the group consisting of gallium, indium, and aluminum, and from 0.1 to 70 atomic percent of one element of Group Ib of the periodic table selected from the group consisting of copper and silver, the total amount of the element of Group IIIb and the element of Ib not exceeding 70 atomic percent.

3 Claims, 3 Drawing Figures

METHOD FOR PRODUCING SUPERCONDUCTING NB₃SN WIRES

This application is a continuation-in-part application of U.S. Patent Application No. 118,994, filed on Feb. 6, 1980, now abandoned.

This invention relates to a method for producing a superconducting wire, particularly a superconducting Nb₃Sn wire suitable for the generation of a strong magnetic field, by a surface diffusion technique.

Nb-Ti type alloy wires have been used heretofore as superconducting wires for the generation of a strong magnetic field. The magnetic field generated by these conventional wires, however, is of 80,000 to 85,000 gauss [corresponding to 8 to 8.5 tesla (T for short)] at the highest, and compound superconductors must be used to generate a strong magnetic field of 12 T or more which is required, for example, in a nuclear fusion reactor. Nb₃Sn compound is known as a superconducting material which meets this need, and a method for drawing it into wires is also known. For example, a so-called "surface diffusion" method is already known for the production of a superconducting wire which comprises passing a wire or tape of niobium (Nb) through a bath of heat-melted tin (Sn) and then heat-treating it to form a layer of Nb₃Sn compound on the surface (M. G. Benz, G. E. Report No. 66-C-044, February 1966.

In recent years, superconducting wires for largesized magnets used in nuclear fusion, high energy physics, energy storage, etc. have been required to possess a higher critical current within a strong magnetic field range of more than 15 T. The aforesaid conventional method cannot meet this requirement. To obtain a magnet capable of generating a high magnetic field, it is necessary to use superconducting wires having both a high upper critical magnetic field $H_{c2}$ and a high critical current density $J_c$ ($J_c$ is a value resulting from division of the critical current measured in a magnetic field by the cross-sectional area of the superconductor). The $J_c$ of Nb₃Sn wires produced by the aforesaid conventional method abruptly decreases in a magnetic field of 13 T or more, and it is difficult to produce superconducting magnets capable of generating a magnetic field of 15 T or more from these wires.

Accordingly, it is an object of this invention to provide a superconducting wire which has a high upper critical magnetic field $H_{c2}$ and a high critical current density $J_c$ and gives a magnet capable of generating a strong magnetic field of 15 T or more.

The object of this invention is achieved by an improved method of this invention which comprises passing a wire or tape of a niobium-base alloy through a molten metal bath containing tin and then heat-treating it to form a Nb₃Sn compound layer on the surface of said wire or tape, said niobium-base alloy being an alloy comprising niobium and 0.1 to 30 atomic percent of hafnium, and said molten metal bath being a molten bath of a tin-base alloy consisting of tin, from 0.1 to 70 atomic percent of one element of Group IIIb of the periodic table selected from the group consisting of gallium, indium and aluminum, and from 0.1 to 70 atomic percent of one element of Group Ib of the periodic table selected from the group consisting of copper and silver, the total amount of the element of Group IIIb and the element of Group Ib not exceeding 70 atomic percent.

In the present specification, the proportions of elements in alloys are all expressed by atomic percent.

The method of this invention is an improvement over a method for making a superconducting Nb₃Sn wire from a wire or tape of a niobium-base alloy and a molten bath of tin or a tin-base alloy by a surface diffusion technique.

The novel feature of the present invention resides in the fact that an alloy of Hf dissolved in Nb is used as a niobium-base alloy in wire or tape form which is a substrate of the superconducting wire, and there is used a tin-base alloy consisting of Sn and 0.7 to 70% of Ga, In or Al (elements of Group IIIb) and 0.1 to 70% of Cu or Ag (elements of Group Ib), the total amount of the Group IIIb element and the Group Ib element being not in excess of 70%. In other words, the outstanding characteristic in the process of this invention lies in the inclusion of Hf in the substrate Nb, and the inclusion of Ga, In or Al and Cu or Ag in the Sn bath.

Use of the alloy of Nb having Hf dissolved therein promotes diffusion of the Nb₃Sn layer and can give Nb₃Sn having high $H_{c2}$ and $J_c$.

The Group IIIb element (Ga, In or Al) serves to markedly improve the $I_c$ of an Nb₃Sn diffused wire in a strong magnetic field of at least about 15 T, but on the other hand, reduces the rate of formation of the Nb₃Sn diffused layer and also increases the crystal grain size of Nb₃Sn. Hence, the Group IIIb element rather decreases $I_c$ in a lower magnetic field of less than about 13 T, and does not so much increase $I_c$ in a magnetic field in the range of about 13 to about 15 T.

In contrast, the Group Ib element (Cu or Ag) increases the rate of formation of the Nb₃Sn diffused layer, and makes it possible to diffuse and form the Nb₃Sn layer by heat treatment at a low heat-treating temperature (600 to 900° C.), or heat-treatment for a short period of time. This consequently, reduces the cost required for heat-treatment, and the crystal grain size of Nb₃Sn becomes fine, so that the Nb₃Sn layer obtained has high $J_c$ and $I_c$. Accordingly, by simultaneously adding Cu or Ag at the time of adding Ga, In or Al to Sn, the effects of synergistically act and make it possible to greatly increase $I_c$ in an entire magnetic field, especially, in a strong magnetic field of at least 15 T. The addition of Hf, as stated above, increases the thickness of the Nb₃Sn layer, and decreases its crystal grain size. It also has the function of promoting diffusion of Ga, In and Al into the Nb₃Sn layer. Accordingly, when adding Ga, In or Al to the Sn bath, it is necessary to add Hf simultaneously to the substrate Nb.

The amount of Hf to be dissolved in Nb is 0.1 to 30 atomic percent, preferably 2 to 10 atomic percent. If it is less than 0.1 atomic percent, the aforesaid effect of adding Hf can scarcely be obtained. If the amount of Hf exceeds 30%, the processability of the Nb-Hf alloy substrate is reduced.

Thus, the present invention brings about the marked advantage that by using a wire or tape of an Nb-base alloy having Hf dissolved therein as a substrate of superconducting wires, the diffusion and formation of a Nb₃Sn layer on the substrate alloy are greatly promoted, and the $H_{c2}$ and the critical current $I_c$ of the wire, and especially $I_c$ and $J_c$ of the wire in a strong magnetic field, are markedly increased.

The aforesaid effect, especially the high $I_c$ in a strong magnetic field, is further increased by adding one of Ga, In, and Al as the Group IIIb element and one of Ag and Cu to Sn and diffusing an alloy consisting of Sn and such two metals into the Nb-base alloy. This can give a Nb$_3$Sn diffused wire having much improved strong field properties. The total amount of Ga, In or Al and Cu or Ag to be included in Sn is not more than 70%, preferably not more than 50%. The amounts of the individual elements are as follows: 0.1 to 70%, preferably 5 to 30%, for Ga; 0.1 to 70%, preferably 10 to 30%, for In; 0.1 to 70%, preferably 5 to 30%, for Al; 0.1 to 70%, preferably 5 to 30%, for Cu; and 0.1 to 70%, preferably 5 to 30%, for Ag. These amounts are desirable in improving the properties of the resulting Nb$_3$Sn layer and preventing inhibition of the diffusion and formation of the Nb$_3$Sn layer. If the total amount of Ga, In or Al as the Group IIIb element and Cu or Ag as the Group Ib element to be added to Sn is less than 0.1%, the effect of addition can scarcely be obtained, and if the total amount of these elements exceeds 70%, the diffusion and formation of the Nb$_3$Sn layer are inhibited.

Generally, the process of making a superconducting wire in accordance with this invention consists of the steps of fabricating an alloy composed of a solid solution of Hf in Nb into a wire or tape in a customary manner, passing the wire or tape through a molten bath, preferably heated at 600 to 1200° C., of an alloy composed of a solid solution in Sn of Ga, In or Al as the Group IIIb element and Cu or Ag as the Group Ib element to diffuse the Sn-base alloy from its surface, and heat-treating the product preferably at 600 to 1200° C. for 1 minute to 200 hours to form a continuous Nb$_3$Sn layer on the surface of the wire or tape.

If the temperature of the molten metal bath and the temperature of heat-treating the wire are lower than 600° C., diffusion of Sn into the Nb-base alloy is difficult. If these temperatures are higher than 1200° C., the crystal grains of the Nb$_3$Sn compound layer become coarse and the superconducting properties of the layer are deteriorated.

The preferred temperature of the molten bath is 800 to 950° C., and the preferred temperature and time for the heattreatment are 850 to 950° C., and 5 minutes to 1 hour, respectively.

The Nb$_3$Sn compound in accordance with this invention contains small amounts of the elements added to the Nb-base alloy or Sn-base alloy except Cu. The presence of these elements and Hf produces an effect of increasing the Hc$_2$ and Jc in a strong magnetic field of the Nb$_3$Sn layer. Cu is not included in the Nb$_3$Sn compound, but serves to promote diffusion and formation of the Nb$_3$Sn layer.

The Nb$_3$Sn diffused wire produced by the method of this invention has a high upper critical magnetic field Hc$_2$ and shows a marked improvement in critical current Ic and critical current density Jc in a strong magnetic field. A wire having a Jc in a strong magnetic field of at least about $5 \times 10^4$ A/cm$^2$ is fully practical. Accordingly, it is very easy for the method of this invention to afford a wire suitable for use in superconducting magnets capable of generating a magnetic field of more than 15 T. The Nb$_3$Sn diffused wire in accordance with this invention can be advantageously used also in power transmission cables because it has a high Jc in a low magnetic field as well as in a strong magnetic field. Because of its high superconducting transition temperature Tc, Nb$^3$Sn is excellent as a material for superconducting power transmission cables. The Nb$_3$Sn superconducting wire in accordance with this invention can be produced easily by utilizing conventional techniques because the substrate wire or tape has good plastic workability. Desirably, the wire produced by the method of this invention is coated with copper or silver to stabilize it against flux jump, or is reinforced with a stainless steel tape, etc. to cause it to withstand an electro-magnetic force.

FIG. 1 of the accompanying drawings is a schematic cross-sectional view of one example of a Nb$_3$Sn diffused tape produced by the method of this invention. A represents a Sn-base alloy; B, a Nb-base alloy substrate; and C, a diffused layer containing a continuous Nb$_3$Sn compound layer.

Figure 2:
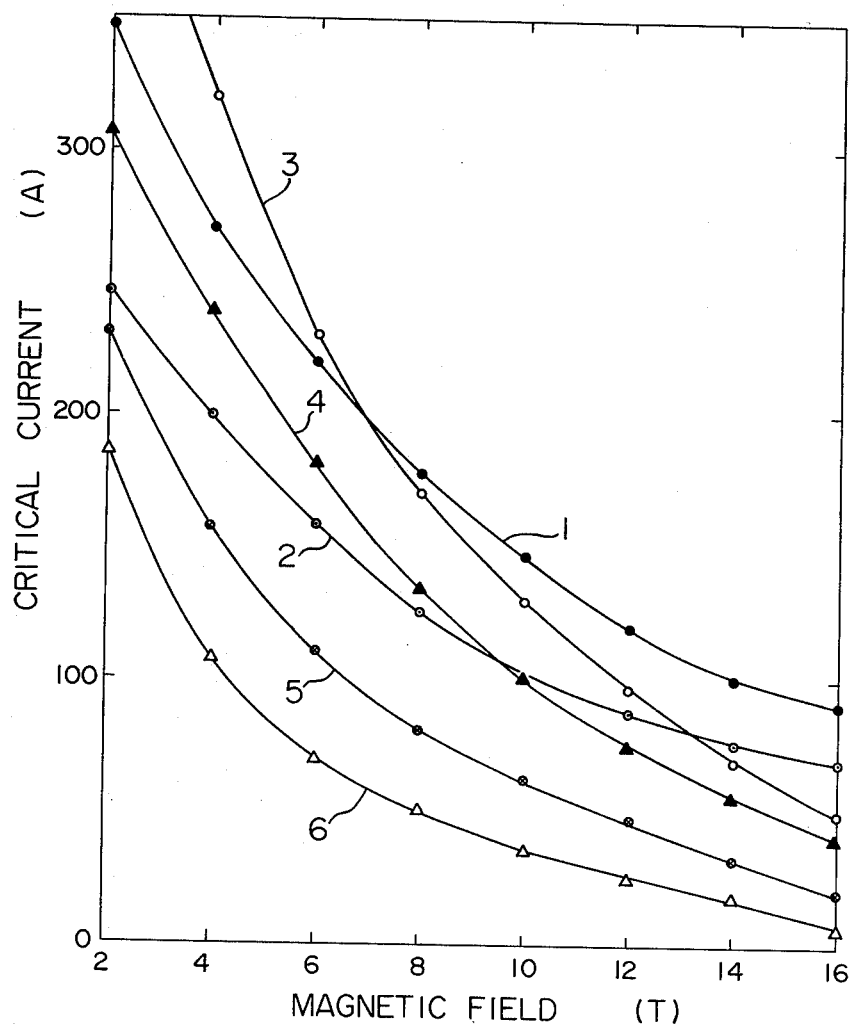
Figure 3:
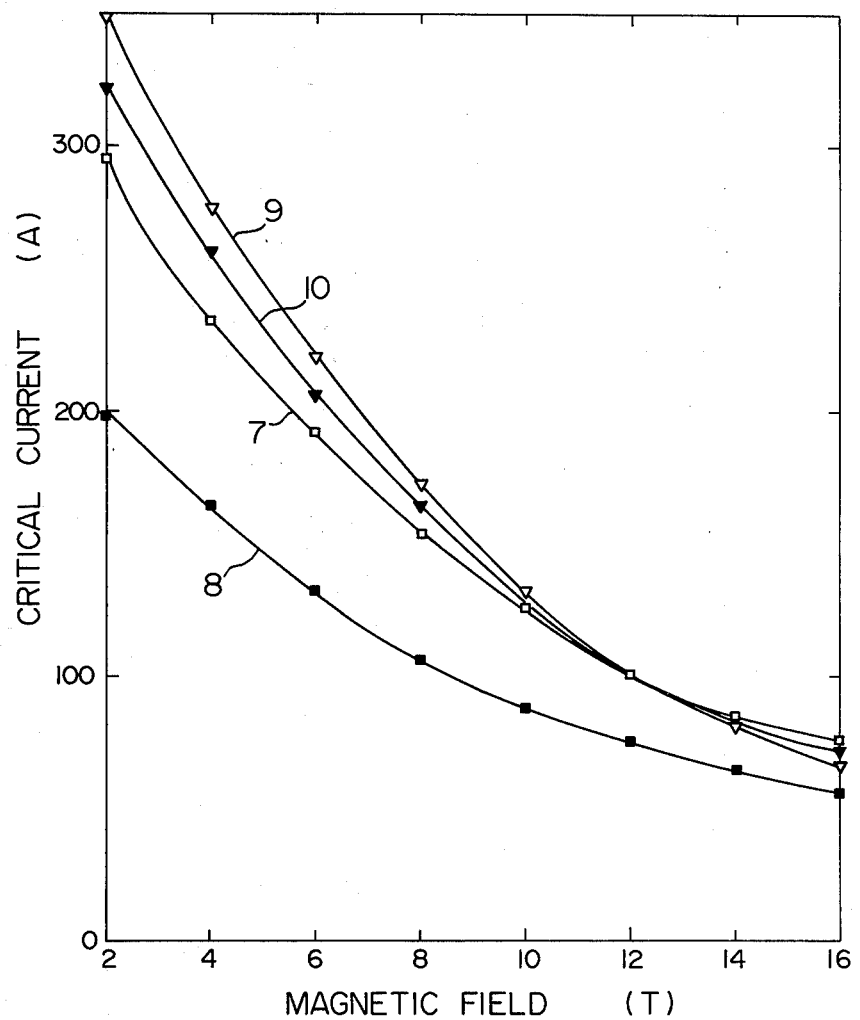

FIG. 2 is a graph showing variations in critical current (curve No. 1) depending upon variations in a magnetic field in liquid helium (4.2K) measured with respect to the Nb$_3$Sn superconducting wire of this invention obtained in Example 1 given hereinbelow, in comparison with controls (curves Nos. 2 to 6); and FIG. 3 is a graph, similar to FIG. 2, showing the wire obtained in Example 2 and a similar control wire (curves Nos. 7 and 8) and similar wires of the invention obtained in Example 3 (curves Nos. 9 and 10).

The following Examples illustrate the present invention more specifically.

EXAMPLE 1

(a) A blend of Nb and 5% of Hf was melted in an arc melting furnace in an argon atmosphere, and rolled into a tape having a width of 3 mm and a thickness of 0.50 mm. Each tape was passed through a bath (at about 900° C.) of a Sn-base alloy consisting of Sn and 15% of Ga and 20% of Cu dissolved therein to diffuse the Sn-base alloy from the surface to the inside of the tape.

Subsequently, the tape was heat-treated continuously in vacuum at 900° C. for 1 hour. Thus, a sample of superconducting wire (sample No. 1) was obtained. The cross sectional structure of the sample after heat-treatment is shown in FIG. 1.

(b) For comparison, three superconducting wire samples (samples Nos. 2, 3 and 4) were obtained in the same way as in (a) above except that a molten bath consisting of an alloy of tin and 15% of Ga dissolved therein, a molten bath of an alloy of tin and 20% of copper dissolved therein, and a molten bath of pure tin were respectively used.

(c) For further comparison, a superconducting wire sample (sample No. 5) was prepared in the same way as in (a) above except that a core tape was made by using pure Nb. Another superconducting wire sample (sample No. 6) was made in the same way as above except that the aforesaid core material and a molten bath of tin alone were used.

The Jc values of samples Nos. 1 to 6 in a magnetic field of 15 T were measured, and the results are shown in Table 1.

TABLE 1

| Sample No. | Element added to Nb-base alloy (%) | Elements added to Sn-base alloy (%) IIIb Ga | Elements added to Sn-base alloy (%) Ib Cu | Jc in a magnetic field of 15 T ($\times 10^4$ A/cm$^2$) |
|---|---|---|---|---|
| 1 | 5 | 15 | 20 | 18.0 |
| 2 | 5 | 15 | — | 12.5 |
| 3 | 5 | — | 20 | 9.0 |
| 4 | 5 | — | — | 8.0 |
| 5 | — | 15 | 20 | 7.0 |
| 6 | — | — | — | 3.5 |

EXAMPLE 2

A superconducting wire sample (sample No. 7) was made in the same way as in Example 1, (a) except that a molten bath of an alloy consisting of tin and 15% of In and 20% of Ag dissolved therein was used.

For comparison, a superconducting wire sample (sample No. 8) was made in the same way as above except that a molten bath of an alloy consisting of tin and 15% of In dissolved therein was used.

The Jc values of these samples in a magnetic field of 15T were measured, and the results are shown in Table 2.

TABLE 2

| Sample | | | |
|---|---|---|---|
| Sample No. | Element added to Nb-base alloy (%) | Elements added to Sn-base alloy (%) | Jc in a magnetic field of 15 T ($\times 10^4$ A/cm$^2$) |
| | | IIIb In    Ib Ag | |
| 7 | 5 | 15    20 | 15.0 |
| 8 | 5 | 15    — | 11.0 |

EXAMPLE 3

A superconducting wire sample (sample No. 9) was made in the same way as in Example 1, (a) except that a molten bath of an alloy consisting of tin and 15% of aluminum and 20% of Cu dissolved therein was used.

Another superconducting wire sample (sample No. 10) was made in the same way as above except that a molten bath of al alloy consisting of Sn and 15% of aluminum and 20% of silver dissolved therein was used.

The Jc values of the samples in a magnetic field of 15T were measured, and the results are shown in Table 3.

TABLE 3

| Sample | | | | |
|---|---|---|---|---|
| Sample No. | Element added to Nb-base alloy (%) | Elements added to Sn-base alloy (%) | | Jc in a magnetic field of 15 T ($\times 10^4$ A/cm$^2$) |
| | | IIIb Al | Ib Cu    Ag | |
| 9 | 5 | 15 | 20    — | 15.5 |
| 10 | 5 | 15 | —    20 | 12.0 |

The results of measurement of H-Ic curves (magnetic field-critical current curves) of samples 1 to 10 at 4.2K are shown in FIGS. 2 and 3. The sample numbers shown in Tables 1 to 3 correspond to the curve numbers in FIGS. 2 and 3.

It is seen from FIGS. 2 and 3 and Tables 1 to 3 that the wires containing an alloy of Nb and Hf dissolved therein as a substrate (samples Nos. 1 to 4 and 7 and 10) generally have higher Ic values than wires containing a substrate of pure Nb (samples 5 and 6). It is also seen that when an Sn-base alloy having dissolved therein both a Group IIIb element and a Group Ib element is diffused from the surface of an Nb-Hf core material, the diffusion and formation of an Nb$_3$Sn layer are promoted and Ic is increased as compared with the case of diffusing an Sn-base alloy having a Group IIIb element alone dissolved therein. For example, when an Sn-Ga-Cu alloy is diffused (sample No. 1), the sample is better than in the case of diffusing an Sn-Ga alloy (sample 2), and when an Sn-In-Ag alloy is diffused (sample 7), the sample is better than in the case of diffusing an An-In alloy (sample 8).

What is claimed is:

1. In a method of producing a superconducting Nb$_3$Sn wire which comprises passing a wire or tape of a niobium-base alloy through a molten metal bath containing tin and then heat-treating it to form a Nb$_3$Sn compound layer on the surface of said wire or tape, the improvement wherein said niobium-base alloy is an alloy comprising niobium and 0.1 to 30 atomic percent of hafnium, and said molten metal bath is a molten bath of a tin-base alloy consisting of tin, from 0.1 to 70 atomic percent of one element of Group IIIb of the periodic table selected from the group consisting of gallium, indium and aluminum, and from 0.1 to 70 atomic percent of one element of Group Ib of the periodic table selected from the group consisting of copper and silver, the total amount of the element of Group IIIb and the element of Group Ib not exceeding 70 atomic percent.

2. The method of claim 1 wherein the molten metal bath is kept at a temperature of from 600 to 1200° C.

3. The method of claim 1 wherein the heat-treatment of said wire or tape which has been passed through said molten metal bath is carried out at a temperature of from 600 to 1200° C. for a period of 1 minute to 200 hours.

* * * * *